US006765410B2

(12) United States Patent
Meneghini

(10) Patent No.: US 6,765,410 B2
(45) Date of Patent: Jul. 20, 2004

(54) METHOD AND APPARATUS FOR PERFORMING A HAZARD-FREE MULTI-BIT COMPARISON

(75) Inventor: Thomas L. Meneghini, Groton, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 35 days.

(21) Appl. No.: 10/027,086

(22) Filed: Dec. 20, 2001

(65) Prior Publication Data

US 2003/0117170 A1 Jun. 26, 2003

(51) Int. Cl.[7] .............................................. H03K 19/21
(52) U.S. Cl. ........................................ 326/52; 326/55
(58) Field of Search ............................. 326/52–55, 93, 326/105

(56) References Cited

U.S. PATENT DOCUMENTS

| | | | | |
|---|---|---|---|---|
| 5,218,246 A | * | 6/1993 | Lee et al. ...................... | 326/55 |
| 5,523,707 A | * | 6/1996 | Levy et al. .................... | 326/52 |
| 5,528,181 A | | 6/1996 | Suggs ......................... | 327/115 |
| 5,534,844 A | | 7/1996 | Norris ....................... | 340/146.2 |
| 5,544,342 A | | 8/1996 | Dean .......................... | 395/446 |
| 5,600,787 A | | 2/1997 | Underwood et al. ... | 395/183.06 |
| 5,910,762 A | | 6/1999 | Kurotsu ................... | 340/146.2 |
| 5,917,364 A | * | 6/1999 | Nakamura .................. | 327/415 |
| 6,236,240 B1 | * | 5/2001 | Hill .............................. | 326/98 |

* cited by examiner

*Primary Examiner*—Don Le
(74) *Attorney, Agent, or Firm*—Lahive & Cockfield, LLP

(57) ABSTRACT

An exclusive OR (XOR) circuit is provided to perform a logical XOR function on multiple bits that eliminates the XOR function hazard. The XOR circuit performs a logical XOR function on data values that have been encoded to prevent the XOR function hazard from occurring.

27 Claims, 7 Drawing Sheets

| *H | *L | Output |
|---|---|---|
| 0 | 0 | Precharge |
| 0 | 1 | False |
| 1 | 0 | True |
| 1 | 1 | Illegal |

*FIG. 5*

METHOD AND APPARATUS FOR PERFORMING A HAZARD-FREE MULTI-BIT COMPARISON

TECHNICAL FIELD OF THE INVENTION

The present invention generally relates to integrated circuits, and more particularly, to an integrated circuit performing a logical function.

BACKGROUND OF THE INVENTION

The Exclusive OR (XOR) logical function contains what is known in the art as a "function hazard". Review of an XOR Karnaugh map shows that a circuit performing a logical XOR function cannot transition from a stable "1" state to the other stable "1" (or from a stable "0" state to the other stable "0" state) without passing through the "0" state (or "1" state) first. This function hazard is part of the XOR logical function and is not a logical hazard, which can arise from poor implementation of a logical function that is free of function hazards. As such, a function hazard results when a logic function transitions between nonadjacent squares of a Karnaugh map. In contrast, a logic hazard is not caused by the output function of the logical operation, but rather the configuration of the circuit to implement the function. For example, the output signal for a combinational circuit that depends on the internal circuit delays, both element and interconnection, as well as the input signals, the combinational circuit is said to contain a logic hazard. As a result, the combinational logic circuit may produce a momentary change in an output signal in response to an input change that does not cause the steady-state output to change or if the output signal is supposed to change it is possible for the output signal to change several times before settling down to its steady-state value.

The XOR function hazard often creates a false output from an XOR logic circuit that can cause a downstream edge-triggered logic circuit or gate to evaluate prematurely. Traditionally, the XOR function hazard is mitigated by adding additional logic elements to the output of the logic circuit performing the XOR logical function to either delay or gate the circuit's output. These logic elements act like a filter to help avoid having downstream logic elements from evaluating invalid data or evaluating prematurely. Because integrated circuit surface area and operating speed are at a premium, the conventional technique for mitigating the detrimental effects of the XOR function hazard are an undue burden on an integrated circuit architecture.

SUMMARY OF THE INVENTION

The present invention addresses the above-described limitations of a logical circuit that performs the XOR logical function in order to simultaneously compare two or more bit pairs, for example, two or more complimentary dual rail bit pairs. The present invention provides an approach to enable a circuit performing a logical XOR function to avoid the XOR function hazard altogether.

In one embodiment of the present invention, an integrated circuit provides a static to dynamic converter circuit that receives a plurality of static input signals and generates a plurality of dual-rail domino output signals. Each of the dual-rail domino output signals have true and complement data components. The manner in which the static to dynamic converter circuit generates the dual-rail domino outputs allows an XOR logic circuit to avoid the XOR function hazard. The integrated circuit also includes an XOR logic circuit coupled to the outputs of the static to dynamic converter circuit. The XOR logic circuit performs a logical XOR function on two or more pairs of the dual-rail domino output signals from the static to dynamic converter circuit. The static to dynamic converter circuit includes a number of cross-coupled circuits where each cross-coupled circuit receives a static logic signal and a clock signal. The clock signal synchronizes operation of each cross-coupled circuit. Each cross-coupled circuit utilizes an implied inversion technique to prevent the static to dynamic converter from asserting an invalid output state.

The XOR logic circuit includes a plurality of dual-rail dynamic logic circuits each without a series evaluate transistor or "footer" device. Each dual-rail dynamic logic circuit is configured to have a first pull-down stack and a second pull-down stack coupled in parallel between a ground node and a dynamic node. The first pull-down stack and the second pull-down stack perform the logical XOR function on a pair of dual-rail domino output signals asserted by the static to dynamic converter circuit.

The above-described approach benefits a semiconductor device, such as a microprocessor that has to compare two or more logic values in a simultaneous manner. As a result, an XOR logic circuit can be used to generate a "finish" signal, which, in turn, can be used to start evaluation of the next stage in a data pipeline without the need for additional circuitry to gate or delay the finish signal to prevent a false start.

In accordance with another aspect of the present invention, a method is performed in an integrated circuit to avoid the function hazard of the logical XOR function. The integrated circuit avoids the XOR function hazard by generating pairs of dual-rail domino output signals from pairs of static input signals in a manner to avoid an unstable state in the logical XOR circuit that causes the XOR function hazard. Each dual-rail domino output signal pair generated is a monotonically rising signal encoded with a third valid state. The integrated circuit performs the logical XOR function on pairs of the dual-rail domino output signals in the logical XOR circuit. The pairs of dual-rail domino output signals generated by the method includes at least a first complementary dual-rail domino signal and a second complementary dual-rail domino output signal to drive the logical XOR circuit. Because the first and the second complementary dual-rail domino output signals are monotonically rising signals encoded with three valid states, the logical XOR circuit is able to transition from a first stable state to a second stable state without having to transition through an unstable state. Hence, the method performs a logical XOR function in an integrated circuit that allows the logical XOR circuit to transition from a first logic "1" state to a second logic "1" state without having to transition through a logic "0" state or from a first logic "0" state to a second logic "0" state without having to transition through a logic "1" state.

The above described approach benefits a very large scale integration (VLSI) architecture that implements a logical XOR function to compare multiple bits, for example a tag comparison inside a cache. In this manner, the VLSI architecture can perform an age comparison of registers associated with the VLSI architecture without having to add additional down stream logic elements to mitigate the effects of the XOR function hazard. Hence, a circuit designer or system architect is provided with greater design freedom, to implement faster and more robust logic circuits.

In yet another embodiment of the present invention, an XOR circuit that is free of the XOR function hazard is provided. The XOR circuit includes an encoder circuit that encodes a plurality of input values. For example, a first input value asserted on a first input node of the encoder circuit and a second input value asserted on a second input node of the encoder circuit into a first output value pair and a second output value pair, respectively. The first output value pair and the second output value pair are asserted on the inputs of an XOR circuit that performs a logical XOR function on the two output value pairs.

The two or more output value pairs are provided to the XOR circuit with three valid states to avoid the XOR function hazard. The three valid states of the plurality of output value pairs include a pre-charge state, a false state and a true state. The encoder circuit utilizes an implied inversion technique within the encoder circuit to encode each input value into their corresponding output value pairs. Each output value pair is a complementary dual-rail domino output signal.

The XOR circuit is configured as a dual-rail dynamic logic circuit without a series evaluate transistor having a plurality of first pull-down stacks and a plurality of second pull-down stacks coupled in parallel between a ground node and a dynamic node. Each first pull-down stack and each second pull-down stack perform a logical XOR function on a first output value pair and a second output value pair.

The above described approach benefits a microprocessor architecture that processes data in that physical registers awaiting retirement can be retired in a quicker more efficient manner. As a result, microprocessor processing efficiency is increased.

BRIEF DESCRIPTION OF THE DRAWINGS

An illustrative embodiment of the present invention will be described below relative to the following drawings in which like reference characters refer to the same parts throughout the different views.

FIG. 5 depicts a logical truth table for the encoded signals generated by the integrated circuit depicted in FIG. 1.

DETAILED DESCRIPTION

The illustrative embodiment of the present invention provides a logic circuit that avoids the XOR function hazard in order to simultaneously compare multiple bits. In the illustrative embodiment, an encoder circuit is adapted to generate complementary dual-rail domino output signals from static input values. The encoder circuit is coupled to an XOR logic circuit to perform a logical XOR function on the complementary dual-rail domino output signals. The XOR logic circuit performs the logical XOR function in a manner that allows the XOR logic circuit to transition from a first stable state to a second stable state without having to pass through an unstable state.

The encoder circuit is synchronized by a clock signal to generate the complementary dual-rail domino output signals. The encoder circuit utilizes an implied inversion technique within its circuitry to prevent the assertion of a complementary dual-rail domino output signal that would cause the generation of an illegal complimentary dual-rail domino state. The XOR logic circuit is adapted to be a dual-rail dynamic logic circuit without a series evaluate transistor, also referred to as a "footer" device. The XOR logic circuit includes at least a first pair of pull-down stacks and at least a second pair of pull-down stacks coupled in parallel between a ground node and a dynamic node. The encoder circuit asserts its output values to the gates of the transistors forming the at least two pair of pull-down stacks to allow the XOR circuit to perform a logical XOR function simultaneously on multiple bits.

In the illustrative embodiment, the logical circuit is attractive for use in microprocessors that process data. The logic circuit allows a logical XOR function to be performed without the risk of a false output caused by the XOR function hazard. As a consequence, the age comparison of registers within the microprocessors can occur in a faster, more efficient manner because the output value asserted by the logic circuit is not encumbered by delay elements or by other gated elements traditionally used to mitigate the consequences of the XOR function hazard.

Figure 1:
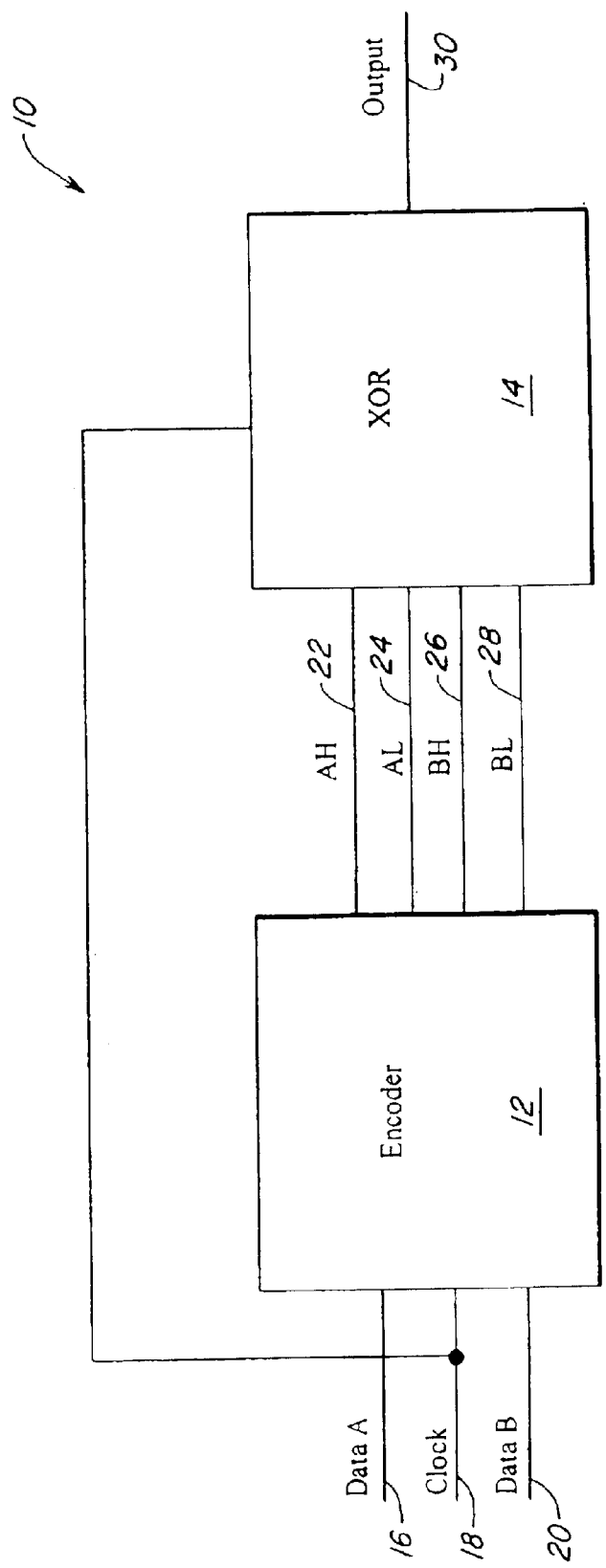
FIG. 1 depicts a block diagram of a logic circuit suitable for practicing the illustrative embodiment of the present invention.

FIG. 1 is a block diagram of the exemplary logic circuit 10 that is suitable for practicing the illustrative embodiment of the present invention. The exemplary logic circuit 10 is configured to include an encoder circuit 12 and an XOR circuit 14. The encoder circuit 12 includes at least three input nodes to receive at least two data signals and a clock signal. For the ease of explanation, the initial detailed description of the encoder circuit 12 and the XOR circuit 14 will be limited to two input signals. This initial discussion of the encoder circuit and the XOR circuit should not be interpreted as limiting the illustrative embodiment, but interpreted as facilitating the detailed description. A more detailed description that illustrates more than two input signals is discussed in detail with reference to FIG. 6 and FIG. 7.

Data signal A is asserted on input node 16 while data signal B is asserted on input node 20 of the encoder circuit 12. The clock signal is asserted on input node 18, which is also coupled to the XOR circuit 14. The encoder circuit 12 generates a complementary dual-rail domino output signal for the data A signal received on input node 16 and a complementary dual-rail domino output signal for the data B signal received on input node 20. The XOR circuit 14 includes output node 30 to assert the result of a logical XOR function on data signal A and data signal B asserted on the input node 16 and 20, respectively. The encoder circuit 12 and the XOR circuit 14 are coupled together via the transmission data paths 22, 24, 26, and 28.

Those skilled in the art will recognize the data labels utilized in FIG. 1 and throughout the specification are meant to facilitate explanation of an illustrative embodiment and are not meant to be limiting in any way of the present invention. Moreover, those skilled in the art will appreciate that the encoder circuit can be adapted to function as a static to dynamic converter circuit. Generation of the complementary dual-rail output signals is synchronized within the encoder circuit 12 by the clock signal asserted on the input node 18. The complementary dual-rail domino output signal generated by the encoder circuit 12 from the data A signal received on the input node 16 is asserted by the encoder circuit 12 as output data signals labeled AH and AL on transmission data paths 22 and 24, respectively. The complementary dual-rail domino output signal generated by the encoder circuit 12 from the data B signal received on the input node 20 is asserted by the encoder circuit 12 as output data signals labeled BH and BL on transmission data paths 26 and 28, respectively. The operation of the encoder circuit 12 is discussed below in more detail with reference to FIG. 3.

Each complementary dual-rail domino output signal generated by the encoder circuit 12 for each input signal includes three valid states, a true state, a false state and a precharge state. The three valid states are discussed below in more detail with reference to FIG. 5. As a consequence of the addition of the third valid state to each complementary dual-rail domino output signal, the XOR circuit 14 is able to transition from a stable logic "1" state to the other stable logic "1" state without passing through an unstable logic "0" state or alternatively, transition from a stable logic "0" state to the other stable logic "0" state without passing through an unstable logic "1" state. As a result, the function hazard typically associated with the logical XOR function is eliminated. Those skilled in the art will recognize that other suitable circuit configurations can be adapted to generate the complimentary dual-rail domino output signals generated by the encoder circuit 12, for example, a sense amplifier.

Figure 2:
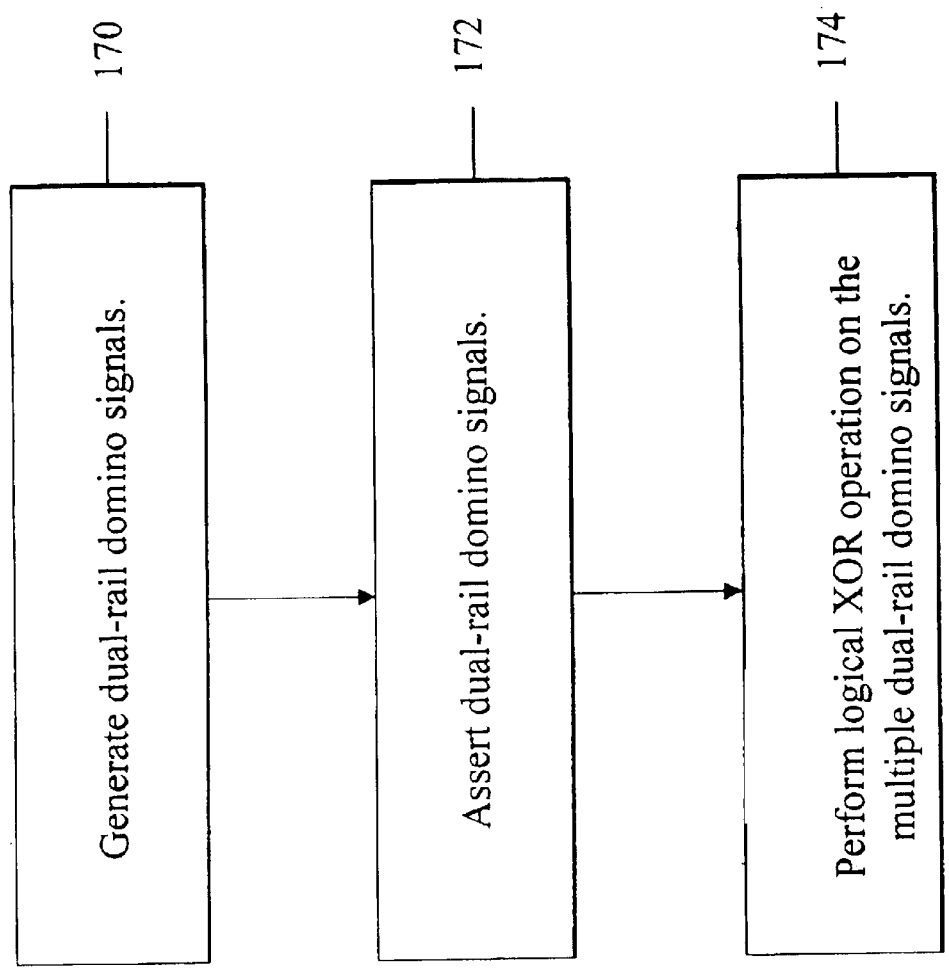
FIG. 2 depicts a flow diagram showing the steps taken to compare multiple bits using a logical XOR function in the illustrative embodiment.

FIG. 2 illustrates the steps taken by the exemplary logic circuit 10 to eliminate the XOR function hazard in a logic circuit performing a logical XOR function to simultaneously compare multiple bits. The encoder circuit 12 of FIG. 1 receives a plurality of static data signals. As depicted, the encoder circuit 12 receives a static data signal on its input node 16 and static data signal on its input node 20, for encoding into two complementary dual-rail domino output signals when the clock signal asserted on input node 18 is in its B phase, that is, at a logic "0" level (step 170). The complementary dual-rail domino output signals generated by the encoder circuit 12 are then asserted on the data transmission paths 22, 24, 26 and 28 by the encoder circuit 12 to drive the XOR logic circuit 14 (step 172). While the clock signal on the input node 18 is in its B phase, the XOR logic circuit 14 performs a logical XOR function on the complementary dual-rail domino output signals asserted by the encoder circuit 12 without having to transition through an unstable state (step 174). The XOR logic circuit 14 asserts the result of the logical XOR function on the output node 30. Those skilled in the art will recognize that the encoder circuit 12 and the XOR logic circuit 14 can be configured as A phase dynamic circuits.

Figure 3:
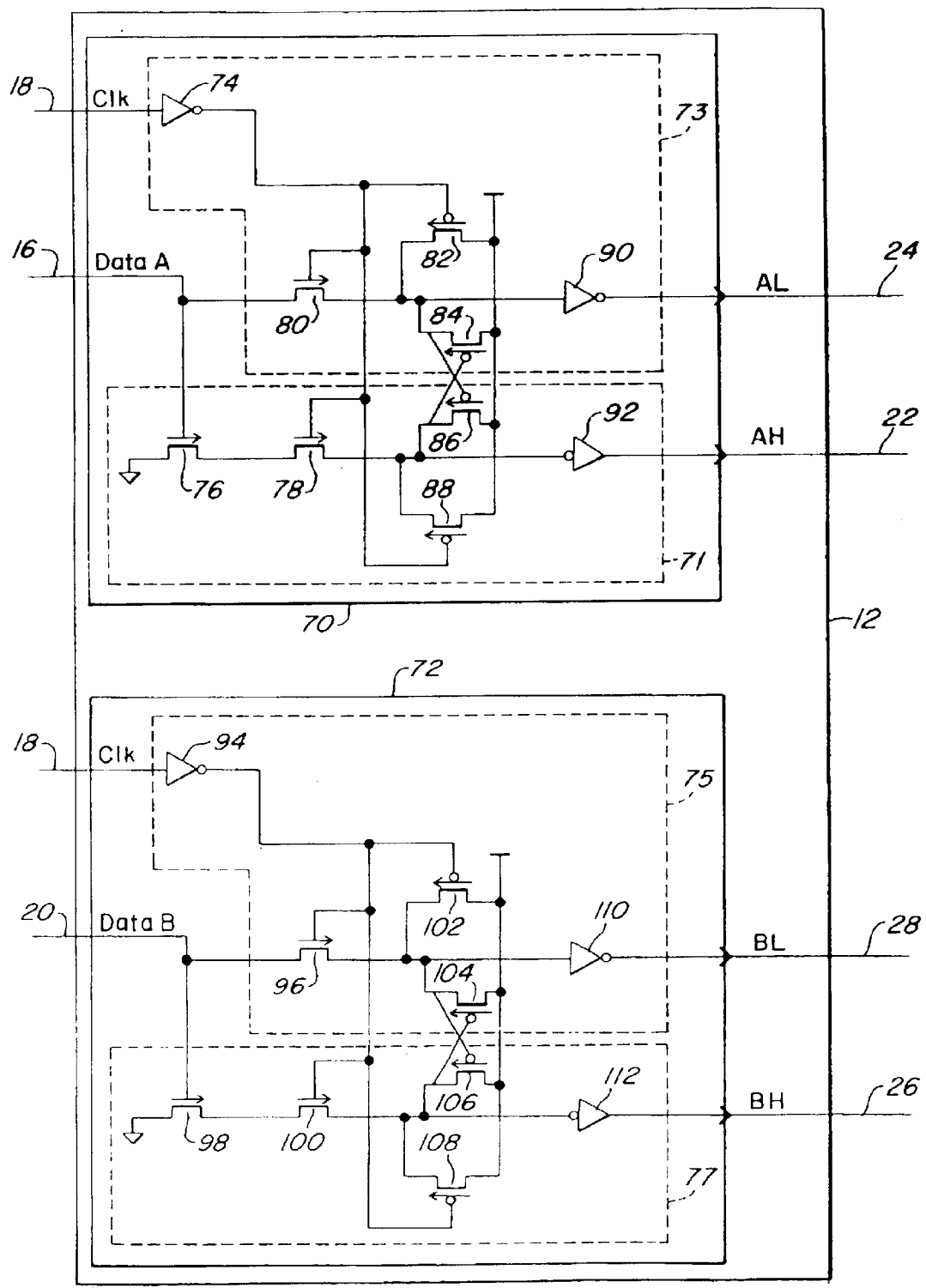
FIG. 3 depicts an electrical schematic that is suitable for implementing the encoding technique of the illustrative embodiment.

FIG. 3 is a schematic diagram that illustrates an exemplary configuration of the encoder circuit 12. The encoder circuit 12 is configured to include at least a first circuit 70 and a second circuit 72 to generate the complementary dual-rail domino output signals of the encoder circuit 12. The first circuit 70 and the second circuit 72 each capture a single ended input signal on input node 16 and input node 20, respectively. The first circuit 70 and the second circuit 72 each latch the received data value on their corresponding input nodes and perform the necessary encoding to generate the complementary dual-rail domino output signals on the data paths 22, 24, 26 and 28.

The first circuit 70 like the second circuit 72 are clock phase sensitive and are configured to evaluate when the clock signal on the input node 18 is in its B phase, that is, when the clock signal is at a logic "0" level. The first circuit 70 and the second circuit 72 are in a precharge state when the clock signal on the input node 18 is in it's A phase, that is, when the clock signal is at a logic "1" level. Nevertheless, one of ordinary skill in the art will recognize that the first circuit 70 and the second circuit 72 can be adapted so that their precharge state occurs when the clock signal on the input node 18 is in its B phase with a corresponding evaluate state when the clock signal on the input node 18 is in it's A phase.

The first circuit 70 includes a first encoding circuit 71 cross-coupled to a second encoding circuit 73. The first encoding circuit 71 is adapted to receive the single ended data signal on input node 16 while the second encoding circuit 73 is adapted to receive the clock signal on the input node 18. The input node 18 is coupled to the input of the inverter 74 which has its output coupled to the gate of PMOS transistor 82, the gate of NMOS transistor 80, the gate of NMOS transistor 78 and the gate of PMOS transistor 88. Those skilled in the art will recognize that PMOS transistor 82 and PMOS transistor 88 act as precharge devices to precharge the dynamic node of the first encoding circuit 71 and the second encoding circuit 73, respectively, when the clock signal asserted on the input node 18 is in it's A phase.

The source of the PMOS transistor 82 and the source of the PMOS transistor 88 along with the source of the PMOS transistor 84 and the source of the PMOS transistor 86 are coupled to a voltage source supplying a high-level voltage signal. The drain of the PMOS transistor 82 is coupled to the drain of NMOS transistor 80, the drain of PMOS transistor 84, the gate of PMOS transistor 86 and the input of the inverter 90. The source of the NMOS transistor 80 is coupled to the input node 16. The output of the inverter 90 is coupled to the data path 24 to provide the complementary portion of the dual-rail domino output signal.

The input node 16 is also coupled to the gate of the NMOS transistor 76 in the first encoding circuit 71. The gate of the NMOS transistor 76, which is also coupled to the source of the NMOS transistor 80 operates to perform an implied inversion of the Data A signal asserted on input node 16. The source of NMOS transistor 76 is coupled to ground while its drain is coupled to the source of NMOS transistor 78. The drain of NMOS transistor 78 is coupled to the drain of PMOS transistor 88, the drain of PMOS transistor 86, the gate of PMOS transistor 84 and the input of the inverter 92. The output of the inverter 92 is coupled to the transmission path 22 to assert what is known in the art as the true portion of the complementary dual-rail domino output signal. Operation of the first circuit 70 is discussed below in detail with reference to FIG. 4.

The second circuit 72 includes a first encoding circuit 77 cross-coupled to a second encoding circuit 75. The first encoding circuit 77 is adapted to receive the single ended data signal on input node 20 while the second encoding circuit 75 is adapted to receive the clock signal on input node 18. The input node 18 is coupled to the input of the inverter 94 which has its output coupled to the gate of PMOS transistor 102, the gate of NMOS transistor 96, the gate of NMOS transistor 100 and the gate of PMOS transistor 108. Those skilled in the art will recognize that PMOS transistor 102 and PMOS transistor 108 act as a precharge device to precharge the dynamic node of the first encoding circuit 77 and the second encoding circuit 75, respectively, when the clock signal asserted on the input node 18 is in its A phase.

The source of the PMOS transistor 102 and the source of the PMOS transistor 108 along with the source of the PMOS transistor 104 and the source of the PMOS transistor 106 are coupled to a voltage source supplying a high level voltage signal. The drain of the PMOS transistor 102 is coupled to the drain of NMOS transistor 96, the drain of PMOS transistor 104, the gate of PMOS transistor 106 and the input of the inverter 110. The source of the NMOS transistor 96 is coupled to the input node 20. The output of the inverter 110 is coupled to the data path 28 to provide the complementary portion of the dual-rail domino output signal.

The input node 20 is also coupled to the gate of the NMOS transistor 98 in the first encoding circuit 77. The source of NMOS transistor 98 is coupled to ground while its drain is coupled to the source of NMOS transistor 100. The configuration of the NMOS transistor 98 with the NMOS transistor 100 operates to perform an implied inversion of the Data B signal asserted on input node 20. The drain of NMOS transistor 100 is coupled to the drain of PMOS transistor 108, the drain of PMOS transistor 106, the gate of PMOS transistor 104 and the input of the inverter 112. The output of the inverter 112 is coupled to the transmission path 26 to assert what is known in the art as the true portion of the complementary dual-rail domino output signal. Operation of the second circuit 72 is discussed below in detail with reference to FIG. 4.

Figure 4:
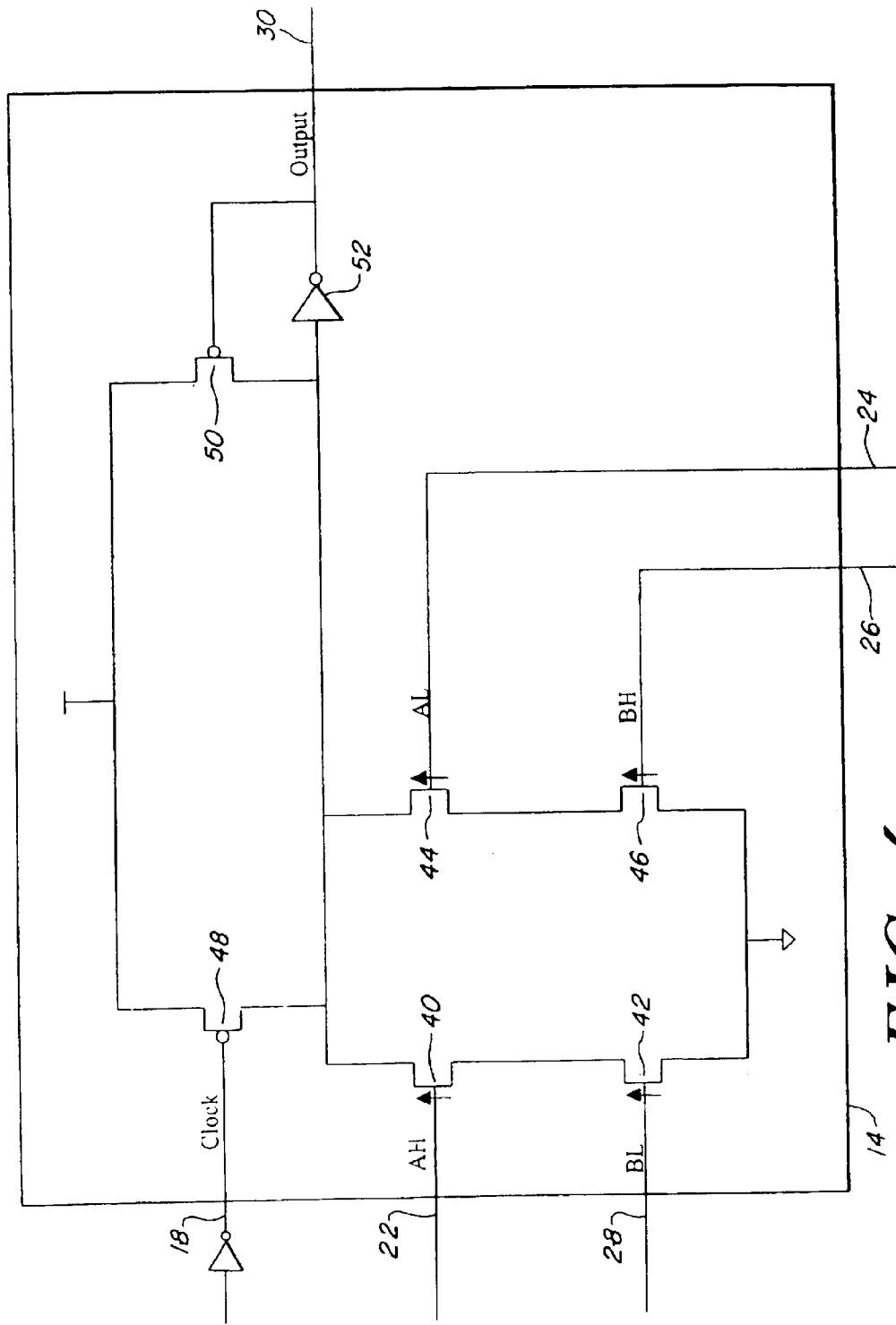
FIG. 4 depicts an electrical schematic that is suitable for implementing a portion of the XOR logical function of the illustrative embodiment.

FIG. 4 illustrates in more detail the XOR circuit 14. The XOR circuit 14 as illustrated utilizes the complementary dual-rail domino output signals encoded by the encoder circuit 12 to perform a logical XOR function thereon, in a manner free of the XOR function hazard. As a result, the XOR circuit 14 is able to transition from a first stable state to a second stable state without having to transition through an unstable state when comparing multiple bits. This results in the elimination of a false output or glitch commonly associated with performing a logical XOR function to simultaneously compare multiple bits.

The XOR circuit 14 is configured as a dual-rail dynamic logic circuit that operates without a series evaluate transistor or "footer" device. Nevertheless, those skilled in the art will recognize that the XOR circuit 14 can be configured to operate with a series evaluate transistor or "footer" device without altering the fundamental nature or function of the circuit. As illustrated, the XOR circuit 14 is a B phase logic circuit, that is, it evaluates the data values asserted by the encoder circuit 12 when the clock at input node 18 is in its B phase or at a logic "0" level. The XOR circuit 14 precharges its dynamic nodes when the clock signal at the input node 18 in its A phase or at a logic "1" level. Those skilled in the art will recognize that the XOR circuit 14 can be adapted to be an A phase dynamic logic circuit.

As configured, the XOR circuit 14 includes at least two transistor pull-down stacks coupled in parallel between a ground node and a dynamic node. The first pull-down stack is formed by the NMOS transistor 40 coupled to the NMOS transistor 42. The NMOS transistor 42 has its source coupled to ground, its gate coupled to the transmission path 28 to receive the data signal labeled BL and its drain coupled to the source of NMOS transistor 40. The NMOS transistor 40 has its gate coupled to the transmission path 22 to receive the data signal labeled AH and its drain coupled to the dynamic node formed at the drain of the PMOS transistor 48. The second transistor pull-down stack is formed by the NMOS transistor 44 coupled to the NMOS transistor 46. The NMOS transistor 46 has its source coupled to ground, its gate coupled to the transmission path 26 to receive the data signal labeled BH and its drain coupled to source of NMOS transistor 44. The NMOS transistor 44 has its gate coupled to the transmission path 24 to receive the data signal labeled AL and its drain coupled to the drain of PMOS transistor 48.

The PMOS transistor 48 has its gate coupled to the input node 18 to receive the clock signal and its source coupled to a voltage source supplying a high-level voltage signal. The drain of NMOS transistor 40 and the drain of NMOS transistor 44 are also coupled to the drain of PMOS transistor 50 and the input of the inverter 52. The output of the inverter 52 is coupled to the output node 30 to assert the result of the logical XOR function. The output of the inverter 52 is also coupled to the gate of PMOS transistor 50. The source of PMOS transistor 50 is coupled to a voltage source supplying a high-level voltage signal. Those skilled in the art will recognize that PMOS transistor 50 is an optional device that operates as a "keeper" to offset the current and charge leakage commonly associated with the two NMOS transistor pull-down stacks.

The truth table 60 illustrated in FIG. 5 depicts the three possible valid states for each complementary dual-rail domino output signal asserted by the encoder circuit 12. The true portion of a complementary dual-rail domino output signal is represented as *H, for example, signals AH and BH and the complementary portion of the dual-rail domino output signal is represented as *L, for example, signals AL and BL. The state of the complementary dual-rail domino output signal is represented under the column labeled output.

The encoder circuit 12 generates at least a pair of complimentary dual-rail domino output signals, but to simplify the discussion below relative to the truth table 60 a single complimentary dual-rail domino signal from the encoder circuit 12 is discussed. Those skilled in the art will recognize that this is merely to facilitate explanation of and is not intended to limit the illustrative embodiment of the present invention in any way or manner. As the truth table 60 depicts, should the encoder circuit 12 assert a complementary dual-rail domino output signal with a true data value of a logic "0" value and a complementary data value of a logic "0" value then the complementary dual-rail domino output signal is in the precharge state. In like fashion, should the encoder circuit 12 assert a complementary dual-rail domino output signal having a true data value of a logic "0" value and a complementary data value of a logic "1" value then the complementary dual-rail domino output signal is in a false state. In like manner, should the encoder circuit 12 assert a complementary dual-rail domino output signal having a true data value of a logic "1" value and a complementary data value of a logic "0" value the complimentary dual-rail domino output signal is in a true state.

As the truth table 60 illustrates, the encoder circuit 12 cannot assert a complementary dual-rail domino output signal having a true data value of a logic "1" value and a complementary data value of a logic "1" value. Consequently, the XOR circuit 14 avoids the unstable state due to the third valid state (precharge) of the complementary dual-rail domino pair and the monitonically rising nature of the complementary dual-rail domino pair proceeding from the third valid state.

In operation, should the clock signal at the input node 18 be in the B phase, and the two data values received by the encoder circuit 12 on input node 16 and input node 20 be at a logic "0" level, the encoded complementary dual-rail domino data values asserted by the encoder circuit 12 are a logic "0" value for the true data signal AH on transmission data path 22, a logic "0" value for the true data signal BH on the data path 26, a logic "1" value for the complementary data signal AL on the transmission data path 22 and a logic "1" value for the data signal BL on the data transmission path 28. The XOR circuit 14 evaluates, in the B phase, the data values asserted by the encoder circuit 12, and asserts a logic "0" value on the output node 30.

In the instance where the clock signal on input node 18 is in the B phase and the data A signal value on the input node 16 is at a logic "0" level and the data value of the data B signal on the input node 20 is at a logic "1" level, the encoder circuit 12 encodes the data values as follows. The true data signal AH asserted on data transmission path 22 is at a logic "0" value while the complementary data signal labeled AL asserted on transmission path 24 is at a logic "1" value. In like fashion, the true data signal BH asserted on the transmission path 26 is at a "1" value while the complementary data signal labeled BL asserted on the data transmission path 28 is at a logic "0" value. As a consequence, the pull-down stack formed by the NMOS transistor 44 and 46 is enabled and the XOR circuit 14 asserts a logic "1" value on output node 30.

Should the data value on the input node 16 be at a logic "1" value and the data value on the input node 20 be at a logic "0" value the encoder circuit 12 asserts the following encoded complementary dual-rail domino signal data values when the clock signal asserted at the input node 18 is in the B phase. The data value of the true data signal labeled AH on transmission path 22 is at a logic "1" value and the data value of the complementary data signal AL asserted on the transmission path 24 is at a logic "0" value. In like fashion, the data value of the true data signal BH asserted on transmission path 26 is at a logic "0" value while the data value asserted for the complementary data signal labeled BL on transmission path 28 is at a logic "1" value. As a result, the pull-down stack formed by NMOS transistor 40 and 42 is enabled, which results in the XOR circuit 14 asserting a data value having a logic "1" value on the output node 30.

In the instance where the clock signal on input node 18 is in the B phase and the data A signal value on the input node is at a logic "1" level and the data value of the data B signal on input node 20 is at a logic "1" level, the encoder circuit 12 encodes the data values as follows. The true data signal AH asserted on data transmission path 22 is at a logic "1" value and the complimentary data signal labeled AL asserted on transmission path 24 is at a logic "0" value. In similar fashion, the true data signal BH asserted on the transmission path 26 is at a logic "1" value, while the complimentary data signal labeled BL asserted on the data transmission path 28 is at a logic "0" value. As a consequence, the XOR circuit 14 asserts a logic "0" value on the output node 30.

As the truth table 60 illustrates, the encoder circuit 12 at no time asserts a complementary dual-rail domino output signal having two values at a logic "1" level, for example, a true data signal AH and a complementary data signal AL both with a logic "1" value. The reason for this is the implied inversion technique utilized by the encoder circuit 12. Because the encoder circuit 12 generates an encoded pair of complimentary dual-rail domino signals that are monotonically rising, the XOR circuit 14 is able to take advantage of the valid third state as well as the monotonic behavior of the encoded data to avoid the XOR operation function hazard. Those skilled in the art will recognize that the encoder circuit 12 and the XOR circuit 14 can be adapted to be either A phase domino circuits or B phase domino circuits and still avoid the XOR function hazard so long as both circuits evaluate and precharge in the same clock phase.

Figure 6:
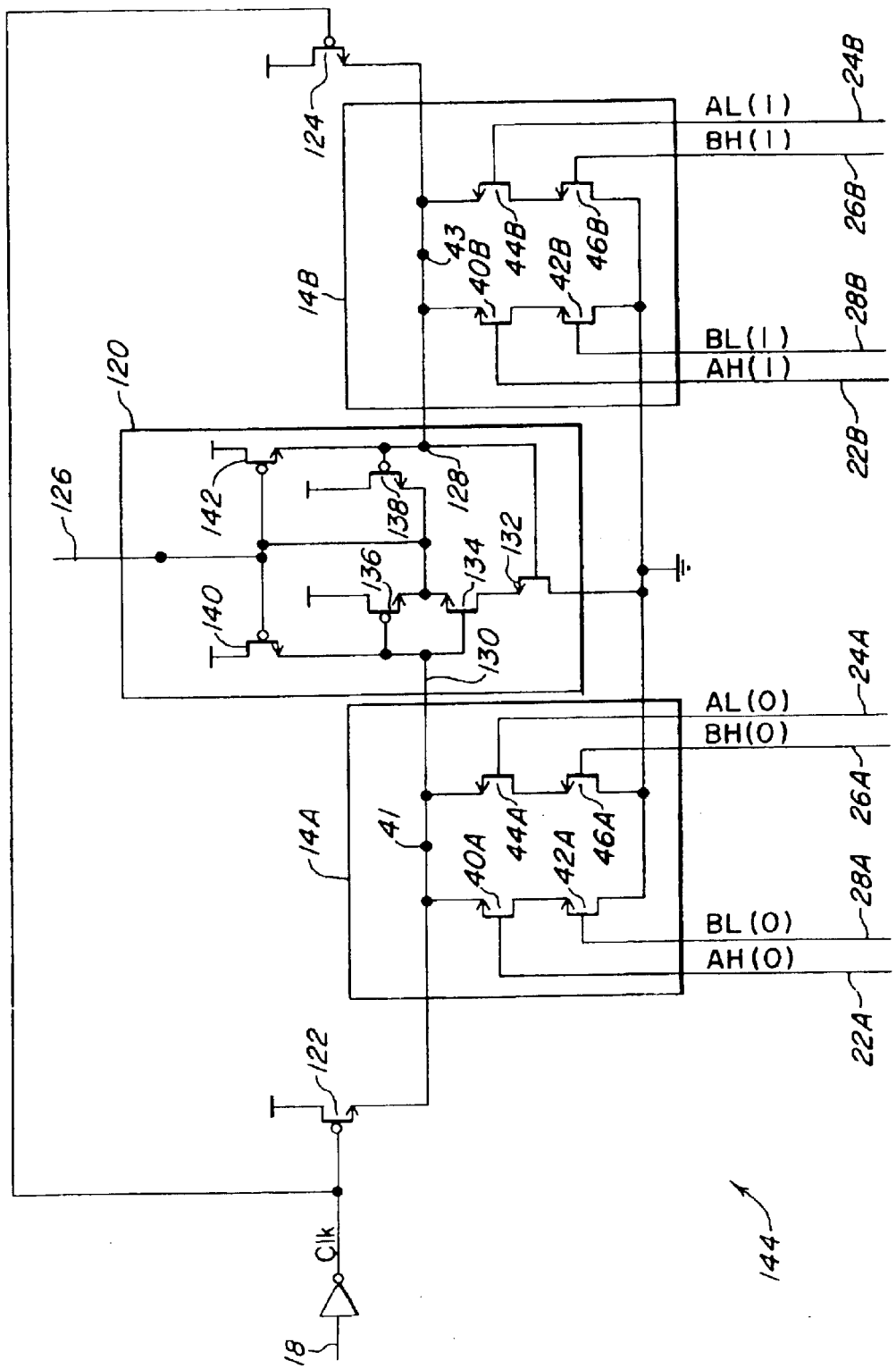
FIG. 6 is a schematic diagram depicting a wide XOR logic circuit suitable for practicing the illustrative embodiment of the present invention.

FIG. 6 illustrates the XOR circuit 14 as an exemplary wide XOR logic circuit 144 for the near simultaneous comparison of a plurality of bits. As such, XOR circuit 14A and XOR circuit 14B are each coupled to an encoder circuit 12A and 12B (not shown) via data transmission paths 22A, 22B, 24A, 24B, 26A, 26B, 28A and 28B, that generate the corresponding complementary dual-rail domino output signals that allow the XOR logic circuit 14A and 14B to avoid the XOR function hazard. Those skilled in the art will recognize that the XOR logic circuit 14A and the XOR logic circuit 14B are a dual-rail domino circuits without a series evaluate transistor. Nevertheless, those skilled in the art will recognize that a series evaluate transistor can be added without departing from the scope of the present invention. XOR logic circuits 14A and 14B are configured and operate in the like manner as the XOR circuit 14 described above.

The output of the XOR logic circuit 14A is coupled to the input node 130 of the NAND logic circuit 120 while the output of the XOR logic circuit 14B is coupled to the input node 128 of the NAND logic circuit 120. The NAND logic circuit 120 performs a logical NAND function on the outputs of the XOR logic circuits 14A and 14B. The dynamic node 41 of the XOR logic circuit 14A is coupled to the drain of the PMOS transistor 122 to allow the PMOS transistor 122 to precharge the dynamic node 41 to a known state when the clock signal on input node 18 is in its B phase. The dynamic node 41 can be used to "wire-or" additional XOR pull-down trees to allow for an even wider XOR structure. In like manner, the dynamic node 43 of the XOR logic circuit 14B is coupled to the drain of the PMOS transistor 124 to allow the PMOS transistor 124 to charge the dynamic node 43 of the XOR logic circuit 14B to a known state during the B phase of the clock signal asserted on the input node 18. In similar fashion, the dynamic node 43 can be used to "wire-or" additional XOR pull-down trees to allow for an even wider XOR structure. The gate of PMOS transistor 122 and the gate of PMOS transistor 124 are both coupled to the input node 18. The source of PMOS transistor 122 and the source of PMOS transistor 124 are both coupled to a voltage source supplying a high-level voltage signal.

The NAND logic circuit 120 performs a logical NAND function and is adapted to include a first input node 130, a second input node 128 and an output node 126. The NAND logic circuit 120 is adapted to include a PMOS transistor 140 having its gate coupled to the gate of PMOS transistor 142, the output node 126, the drain of PMOS transistor 136, the drain of PMOS transistor 138 and the drain of NMOS transistor 134. The source of PMOS transistors 140, 142, 136, and 138 are all coupled to a voltage source supplying a high-level voltage signal. The drain of the PMOS transistor 140 is coupled to the gate of PMOS transistor 136, the gate of NMOS transistor 134 and the input node 130. The drain of PMOS transistor 142 is coupled to the gate of PMOS transistor 138, the input node 128 and the gate of NMOS transistor 132. The source of NMOS transistor 134 is coupled to the drain of NMOS transistor 132, which has its source coupled to ground.

In operation, the NAND logic circuit 120 performs a logical NAND function on the data values asserted by the XOR logic circuit 14A and the XOR logic circuit 14B. The results of the logical NAND function from the NAND logic circuit 120 are asserted on the output node 126. Those skilled in the art will recognize that the wide XOR logic circuit 144 illustrated in FIG. 6 can be expanded upon to include additional XOR logic circuits in parallel to the illustrated XOR circuit 14A and 14B. As such, multiple XOR logic circuits free of the XOR function hazard can be utilized to determine a content value of a physical register, or perform a miss-comparison.

Figure 7:
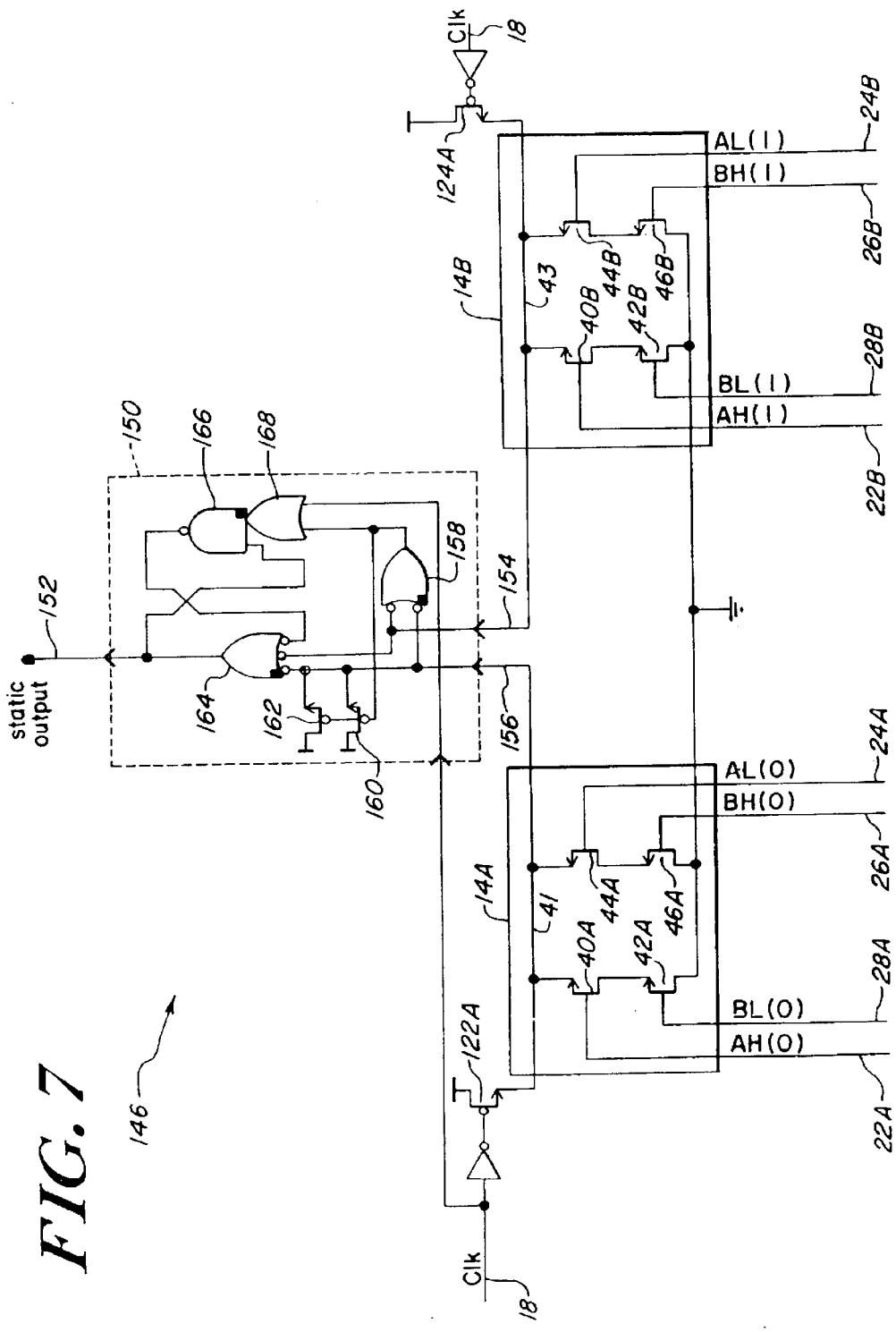
FIG. 7 is a schematic diagram illustrating a wide XOR logic circuit suitable for practicing an illustrative embodiment of the present invention.

FIG. 7 illustrates an exemplary wide XOR logic circuit 146 utilized to drive the dynamic latch 150. Those skilled in the art will recognize that XOR logic circuit 14A and XOR logic circuit 14B are configured in like fashion and operate in like manner to the XOR logic circuit 14 described above. Moreover, those skilled in the art will also recognize that the data transmission paths 22A, 22B, 24A, 24B, 26A, 26B, 28A, and 28B are coupled to corresponding transmission encoder circuits 12A and 12B (not shown). The output of the XOR circuit 14A is coupled to the input node 156 of the dynamic latch 150 while the output of the XOR logic circuit 14B is coupled to the input node 154 of the dynamic latch 150. The PMOS transistor 122A and PMOS transistor 124A operate as precharge devices to precharge the dynamic nodes of the XOR logic circuit 14A and the XOR logic circuit 14B, respectively. As configured, the exemplary wide XOR logic circuit 146 is able to store its output value for at least one clock cycle. In this manner, the dynamic latch 150 can convert the dynamic, clock-like input signals to static signals.

The dynamic latch 150 is configured to include a two input NAND gate 158 having one input coupled to the input node 156 and to one input of the three input NAND gate 164. The second input of NAND gate 158 is coupled to the input node 154 and to a second input of the NAND gate 164. The output of NAND gate 158 is coupled to the gate of PMOS transistor 160, the gate of PMOS transistor 162 along with one input to the OR gate 168. The second input of the OR gate 168 is coupled to the clock input node 18. The output of the OR gate 168 is coupled to a first input of the NAND gate 166. A second input of the NAND gate 166 is cross coupled to the output of the NAND gate 164. The output of the NAND gate 166 is cross-coupled to a third input of the NAND gate 164. The output of the NAND gate 164 is also coupled to the output node 152. The PMOS transistor 160 and the PMOS transistor 162 each have their source coupled to a voltage source supplying a high-level voltage signal. The drain of PMOS transistor 162 is coupled to a second input of the NAND gate 164. The drain of PMOS transistor 160 is coupled to a first input of the NAND gate 164.

The dynamic latch 150 operates as a B phase dynamic latch. The dynamic latch 150 is level sensitive and not edge sensitive. The dynamic latch 150 is able to convert dynamic, clock-like signals into static signals. During the evaluate phase of the dynamic latch 150, the latch evaluates the data values on the input node 156 and the input node 154, and asserts a corresponding output at the output node 152. When the dynamic latch 150 closes and becomes opaque, the input node 156 and input node 154 are precharged to a logic "1" level. If during the start of the evaluate phase of the dynamic latch 150, the output node 152 is at a logic "1" level, the output node 152 transitions to a logic "0" level if input nodes 154 and 156 are also at a logic "1" level. If during the evaluate phase of the dynamic latch 150, the input node 156 or the input node 154 or both the input nodes 154 and 156, transitions from a logic "1" level to a logic "0" level. The output node 152 rises to a logic "1" level; otherwise the output node 152 remains at a logic "0" level. Those skilled in the art will recognize that the dynamic latch 150 is often referred to as a B phase dynamic latch because it evaluates during the B phase of the clock, that is, when the clock is at a low logic level and is latched or opaque in the A phase of the clock, that is, when the clock is at a high logic level. Moreover, those skilled in the art will recognize that PMOS transistors 160 and 162 operate as "keeper" devices to maintain the state of the inputs 156 and 158 to overcome any leakage current through the XOR logic circuit 14A and the XOR logic circuit 14B.

While the present invention has been described with reference to a preferred embodiment thereof, one skilled in the art will appreciate that various changes in form and detail may be made without departing from the intended scope of the present invention as defined in the pending claims. For example, bipolar transistors may be used rather than FETS. Further, the logic "0" levels referred to throughout this text refer to a voltage level that is approximately 0 volts, and the logic "1" levels referred to throughout this text refer to a voltage level that is approximately 1.0 volts.

What is claimed is:

1. A digital logic circuit to perform an exclusive or (XOR) logic function without the logic circuit entering an unstable state comprising:

an input circuit to convert a plurality of static input signals to a plurality of complimentary dual-rail domino output signals having one or more valid states; and an output circuit to perform a plurality of said XOR logic functions on said plurality of complimentary dual-rail domino output signals without the digital logic circuit entering the unstable state.

2. The digital logic circuit of claim 1, wherein said output circuit comprises a plurality of XOR logic circuits coupled in parallel to perform said plurality of said XOR logic functions on said plurality of complimentary dual-rail domino output signals.

3. The digital logic circuit of claim 2, wherein each of said plurality of XOR logic circuits comprises a dual-rail dynamic domino logic circuit having a first pull-down stack and a second pull-down stack coupled in parallel between a ground node and a dynamic node to perform said XOR logic function.

4. The digital logic circuit of claim 2, further comprising a logic circuit that performs a logical 'NAND' function on a plurality of outputs of said output circuit, wherein said logic circuit partitions said output circuit into at least a first portion and a second portion to perform said logical 'NAND' function.

5. The digital logic circuit of claim 1, wherein the one or more valid states comprises one of a precharge state, a true state and a false state.

6. A method for performing a near simultaneous comparison of multiple bits in a digital logic circuit using a logical XOR function in a manner that avoids an XOR function hazard of the logical XOR function, said method comprising the steps of:

generating a plurality of dual-rail domino signal pairs from a plurality of input signals in a manner that avoids an unstable state in the digital logical XOR circuit to avoid the XOR function hazard in the digital logical XOR circuit; and performing the logical XOR function on the plurality of said dual-rail domino signal pairs in the digital logical XOR circuit to perform the near simultaneous comparison of bits without the digital logical XOR circuit entering the unstable state.

7. The method of claim 6, wherein each of the plurality of dual-rail domino signal pairs comprises a first complementary dual-rail domino value and a second complementary dual-rail domino value.

8. The method of claim 7, wherein each of said first and said second complementary dual-rail domino values allow said logical XOR circuit to transition from a first stable state to a second stable state without having to transition through said unstable state when performing the near simultaneous comparison of multiple bits.

9. A circuit to perform a substantially simultaneous comparison of multiple bits, comprising:

an encoder circuit to receive a plurality of input signals and generate a plurality of dual-rail domino output signals from the plurality of input signals in a manner that prevents of each of said plurality of dual-rail domino output signals from entering an invalid state; and an exclusive OR (XOR) logic circuit not subject to an XOR function hazard to perform the substantially simultaneous comparison of multiple bits in the plurality of dual-rail domino output signals from said encoder circuit.

10. The circuit of claim 9, wherein said encoder circuit comprises, a plurality of first encoder circuits to generate a plurality of first dual-rail domino output signals from a plurality of first input signals; and a plurality of second encoder circuits to generate a plurality of second dual-rail domino output signals from a plurality of second input signals.

11. The circuit of claim 10, wherein each of the plurality of first encoder circuits comprises, a first circuit cross-coupled to a second circuit, wherein said second circuit receives at least one value of said first input signal and said first circuit receives a clock signal, wherein said first circuit and said second circuit convert the at least one value of said first input signal to one of said first dual-rail domino output values in a manner that prevents generation of an invalid output state for each of the first dual-rail domino output signals to prevent a logic function hazard in said XOR circuit.

12. The circuit of claim 10, wherein each of the plurality of second encoder circuits comprises, a first circuit cross-coupled to a second circuit wherein said second circuit receives at least one value of said second input signal and said first circuit receives said clock signal, wherein said first circuit and said second circuit convert the at least one value of said second input signal to one of said second dual-rail domino output signals in a manner that prevents generation of an invalid output state to prevent a logic function hazard in said XOR circuit.

13. The circuit of claim 9, wherein said encoder circuit generates the plurality of dual-rail domino signals for each of said plurality of input signals when said clock signal enters its "B" phase.

14. The circuit of claim 9, wherein said XOR logic circuit comprises, a plurality of dual-rail dynamic logic circuits each with or without a series-evaluate transistor and each of the plurality of dual-rail dynamic logic circuits having a first pull-down stack and a second pull-down stack coupled in parallel between a ground node and a dynamic node, wherein the plurality of first pull-down stacks and the plurality of second pull-down stacks in the plurality of dual-rail dynamic logic circuits perform said XOR function on said plurality of dual-rail domino output signals of said static to dynamic converter circuit.

15. The circuit of claim 14, wherein said XOR logic circuit further comprises, a first plurality of input nodes and a second plurality input nodes to receive a plurality of outputs of said first encoder circuit; and a third plurality of input nodes and a fourth plurality of input nodes to receive a plurality of outputs of said second encoder circuit, wherein each of said plurality of second input nodes and each of said plurality of third input nodes are each coupled to one of said plurality of first pull-down stacks and each of said plurality of first input nodes and each of said plurality of fourth input nodes are coupled to one of said plurality of second pull-down stacks.

16. The circuit of claim 9, further comprising a clocked storage element coupled to an output of said XOR circuit to store a result of said XOR function for at least one clock cycle.

17. The circuit of claim 16, wherein said clocked storage element comprises a level sensitive latch.

18. An XOR logic circuit to compare multiple bits comprising, an encoder circuit to encode a plurality of input values asserted on a plurality of input nodes of said encoder circuit into a plurality of output value pairs; and an output circuit to perform a logical XOR function on the plurality of output value pairs to perform the comparison of the multiple bits, wherein each of the plurality of output value pairs each have three states to allow said XOR logic circuit to operate without an XOR function hazard when comparing the multiple bits.

19. The XOR logic circuit of claim 18, wherein said three valid states of each of said plurality of output value pairs comprises a precharge state, a false state and a true state.

20. The XOR logic circuit of claim 19, wherein said encoder circuit utilizes an implied inversion technique to encode each of said plurality of input values.

21. The XOR logic circuit of claim 19, wherein each of said plurality of output value pairs comprise complementary data values when said encoder circuit is in an evaluate state.

22. The XOR logic circuit of claim 18, wherein each of said plurality of output values comprise like data values when said encoder circuit is in a precharge state.

23. The XOR logic circuit of claim 18, wherein said output circuit comprises, a plurality of dual-rail dynamic logic circuits each with or without a series-evaluate transistor and each having a first pull-down stack and a second pull-down stack coupled in parallel between a ground node and a dynamic node, wherein said first pull-down stack and said second pull-down stack perform said logical XOR function on one of said plurality of output value pairs.

24. A logic circuit to perform an exclusive or (XOR) logic function without the logic circuit entering an unstable state comprising:

an input circuit to convert a plurality of static input signals to a plurality of complimentary dual-rail domino output signals having one or more valid states; and an output circuit having a plurality of XOR logic circuits coupled in parallel to perform a plurality of said XOR logic functions on said plurality of complimentary dual-rail domino output signals without the logic circuit entering the unstable state.

25. The logic circuit of claim 24, wherein each of said plurality of XOR logic circuits comprises a dual-rail dynamic domino logic circuit having a first pull-down stack and a second pull-down stack coupled in parallel between a ground node and a dynamic node to perform said XOR logic function.

26. The logic circuit of claim 24, further comprising a logic circuit that performs a logical 'NAND' function on a plurality of outputs of said output circuit, wherein said logic circuit partitions said output circuit into at least a first portion and a second portion to perform said logical 'NAND' function.

27. The logic circuit of claim 24, wherein the one or more valid states comprises one of a precharge state, a true state and a false state.

* * * * *